United States Patent [19]

Patel et al.

[11] Patent Number: 5,015,329

[45] Date of Patent: * May 14, 1991

[54] PRE-SWELLING AND ETCHING OF PLASTICS FOR PLATING

[75] Inventors: Gordhanbhai N. Patel, Somerset; Durgadas Bolikal, Highland Park, both of N.J.; Richard A. Bellemare, Watertown, Conn.

[73] Assignee: JP Laboratories, Inc., Piscataway, N.J.

[*] Notice: The portion of the term of this patent subsequent to Jul. 17, 2007 has been disclaimed.

[21] Appl. No.: 489,366

[22] Filed: Mar. 6, 1990

Related U.S. Application Data

[63] Continuation of Ser. No. 268,154, Nov. 7, 1988, Pat. No. 4,941,940.

[51] Int. Cl.$^5$ .............................................. B05D 3/10
[52] U.S. Cl. .................................... 156/628; 156/668; 427/307
[58] Field of Search .................. 156/628, 651, 668; 427/304, 305, 306, 307, 444, 322

[56] References Cited

U.S. PATENT DOCUMENTS

| | | | |
|---|---|---|---|
| 3,649,391 | 3/1972 | Lewis | 156/654 |
| 3,660,293 | 5/1972 | Maguire et al. | 156/651 |
| 3,671,289 | 6/1972 | Maguire et al. | 156/628 |
| 3,758,332 | 9/1973 | Dinella et al. | 156/668 |
| 3,795,622 | 3/1974 | Dutkewych | 156/668 |
| 4,042,730 | 8/1977 | Cohen et al. | 427/306 |
| 4,125,649 | 11/1978 | Donovan et al. | 156/628 |
| 4,216,246 | 8/1980 | Iwasaki et al. | 427/43.1 |
| 4,268,536 | 5/1981 | Beckenbaugh et al. | 427/54.1 |
| 4,281,034 | 7/1981 | Narayan | 156/668 |
| 4,297,436 | 10/1981 | Kubotera et al. | 156/643 |
| 4,335,164 | 6/1982 | Dillard et al. | 156/668 |
| 4,592,929 | 6/1986 | Tubergen et al. | 427/306 |
| 4,594,311 | 6/1986 | Frisch et al. | 427/98 |
| 4,601,916 | 7/1986 | Arachtingi | 427/97 |
| 4,725,504 | 2/1988 | Knudsen et al. | 428/458 |
| 4,775,557 | 10/1988 | Bastenbeck et al. | 156/668 |
| 4,803,097 | 2/1989 | Fraenkel et al. | 427/306 |
| 4,832,799 | 5/1989 | Knudsen et al. | 427/306 |
| 4,873,136 | 10/1989 | Foust et al. | 156/659.1 |
| 4,895,739 | 1/1990 | Bladon | 427/301 |
| 4,941,940 | 7/1990 | Patel et al. | 156/628 |

FOREIGN PATENT DOCUMENTS

| | | |
|---|---|---|
| 0052968 | 6/1982 | European Pat. Off. |
| 156120 | 10/1985 | European Pat. Off. |
| 309243 | 3/1989 | European Pat. Off. |
| 317748 | 5/1989 | European Pat. Off. |
| 8700391 | 1/1987 | PCT Int'l Appl. |

*Primary Examiner*—Richard V. Fisher
*Assistant Examiner*—John J. Bruckner
*Attorney, Agent, or Firm*—Omri M. Behr

[57] ABSTRACT

Formulations are provided for pre-swelling and etching of functionalized polymers, such as polycarbonate in two or three steps. The etched surface can then be plated with electroless nickel or copper with satisfactory adhesion of the plated metals. Swelling agents make polymer molecules on and near the surface of the polymer easily accessible to a degradation agent. A degradation agent degradates the polymer molecules. If required, a solubilizing agent increases the miscibility of the degradation agent and the swelling agent. A wetting agent increases the effectiveness of the etching agent. In a two-step process, polymer parts are first treated with a solution of a swelling agent followed by etching with a solution of degradation agent.

13 Claims, No Drawings

PRE-SWELLING AND ETCHING OF PLASTICS FOR PLATING

This application is a continuation of application Ser. No. 07/268,154, filed 11/7/88 now U.S. Pat. No. 4,941,940.

BACKGROUND OF THE INVENTION

Field of the Invention

This invention relates to formulations and processes for swelling, etching and plating for decorative and functional purposes of plastics of functionalized polymers, suitably those having at least one hydrolyzable functionality such as anhydride, carbonate, ester (carboxyl and sulfonic), amide, urethane and imide. The polymer could be a copolymer and/or an alloy of two or more polymers. The invention is of particular value with poly(oxy-carbonyloxy-1,4-phenylene-isopropylidene-1,4-phenylene), referred herein as polycarbonate and/or PC. The etching formulations utilize at least one swelling agent and at least one degradation agent. The etched surface can be plated with electroless nickel or copper with satisfactory adhesion of the plated metals.

BRIEF DESCRIPTION OF THE PRIOR ART

General Prior Art

General art of etching and plating of plastics, including formulations and processes is described in a number of books and reviews including: 1. Guidebook Directory, Metals and Plastics Publications, Inc., Hackensack, N.J. 1988; 2. Standards and Guidelines for Electroplated Plastics, American Society of Electroplated Plastics, Englewood Cliffs, N.J. 1984; 3. Metallic Coating of Plastics, W. Goldie, Electrochemical Publication Ltd., Hatch End, England, 1968; and 4. Electroplating of Plastics, I. R. Weiner, Finishing Publications Ltd., Hampton Hill, England, 1977. Plastic parts are subjected to the following major processes to plate them: pre-swelling (if required), etching, neutralizing, catalyzation, acceleration, electroless plating and electroplating. The details of these processes and formulations are given in the above references.

Prior Art for Polycarbonate

Polymeric plastics are plated for decorative and functional reasons such as decoration and electromagnetic interference (EMI) shielding. In order to prevent EMI from escaping the source and protect sensitive electronic equipment from outside EMI sources, electronic equipment which can generate frequency between $10^4$ to $10^9$ (10,000 to 10 billion) cycles per second should be shielded. The most widely used plastic for housing electronic devices is polycarbonate. Polycarbonate is generally unaffected by aqueous solution of etchants and hence requires pre-swelling. The terms, swelling, pre-swelling, pre-etching, pre-conditioning, and pre-treatment are used interchangeably herein.

Many polymers having hydroxylatable functionalities, such as polycarbonate have tough surfaces. They cannot be sufficiently etched with common aqueous etchants such as aqueous chromic acid or aqueous alkali metal hydroxides. Pre-swelling is required for fast etching. In particular, polycarbonate is not soluble in a number of common organic solvents. The good or "fast" solvents are those in which it is highly soluble at room temperature. The "poor", "slow" or "minor roughening" solvents are those in which it has limited solubility at room temperature. The nonsolvents are those in which it is insoluble.

Good solvents usually cause excessive swelling, hence a surface which is very rough and unsuitable for subsequent plating. If transparent plastic is used, it becomes essentially opaque. With poor solvents which cause a proper degree of swelling, the surface is uniformly micro-roughened and can be plated. If transparent plastic is used, it becomes translucent in a poor solvent. This properly swollen surface is required for proper etching and plating of plastics. Nonsolvents do not swell the plastic and hence there can be no adhesion for plating. Thus, if a transparent sheet is used, it remains transparent.

Preswollen PC is easy to degrade as the swelling provides a higher surface area and porous surface. As a result, the etching/degradation is rapid. The roughened surface also provides a strong mechanical bonding between the plastic and the plated metals to be plated thereon. Degradation of PC provides polar functionalities such as —OH and —COOH on the micro-roughened surface which, in turn, provides a wettable surface. Such a wettable surface is required for electroless plating of metals as all commercially available plating baths are aqueous.

One pre-swelling system available commercially, uses toxic halocarbon solvents for pre-swelling and is frequently followed by chromic acid as an etchant. For example, the pre-swelling system offered by Shipley Inc., (according to the Material Safety Data Sheet of Shipley for PM-921 Conditioner) uses dichloropropanol to pre-etch polycarbonate.

There is a need for a nontoxic solvent for pre-etching polycarbonate. There is also a need for a etching system for polycarbonate which is nontoxic and provides excellent adhesion of electroless copper or nickel (at least as good as that obtained with chromic acid). In order to reduce the cost due to drag out and save time, it is desirable to utilize one bath to simultaneously achieve swelling and etching of polycarbonate.

As halocarbons can undergo dehydrohalogenation and oxidation, it is difficult to prepare a stable bath containing a mixture of halocarbon (as pre-etch) with either a strong base etchant or with chromic acid which is a strong oxidizing agent. In addition, chromic acid is toxic, expensive, produces a toxic fumes. Furthermore, recovery of chromium and waste disposal of chromium (sludge) is expensive. While alkali metal hydroxides have been used for etching polycarbonate, they are not very effective in providing a surface with satisfactory properties for electroless plating. The use of mixtures of swelling agents (and/or solubilizing agents) and degradation agents as etching systems for polycarbonate has not been reported.

Prior Patents

A number of patents have been issued on swelling, etching, and plating of plastics. Most of these patents relate to etching of ABS (a coplymer of acrylonitrile, butadiene, and styrene) with chromic acid. There are several patents on pre-swelling and non-chromic acid etching.

U.S. Pat. No. 3,649,391 describes a process for producing a marking receptive (pre-swelling/etching) surface of polystyrene by action of a solution of chloromethane, perchloroethylene, and heptane. The claimed formulations can be used for polystyrene only. U.S. Pat.

Nos. 3,660,293, 3,671,289, 3,795,622 and 4,281,034 describe processes of increasing adhesion of electroless metals by pre-swelling ABS with aqueous solutions of hydroxylated and etherified monoacetate, e.g., glycol diacetate and cellusolve acetate; five membered heterocyclic compounds such as propylene carbonate and mixture of halocarbons and etchanol. These patents do not describe the art of pre-swelling polycarbonate or other plastics. A method of increasing adhesion of polyepoxy is presented in U.S. Pat. No. 3,758,332. The surface of polyepoxy is swollen with solvents such as methylethyl ketone, tetrahydrofuran, dioxane and like. Processes of pre-swelling polyamides with aqueous solution of oragnic acids such as trichloroacetic acid and other chlorinated solvents such as dichloropropanol are described in U.S. Pat. Nos. 4,125,649 and 4,335,164. U.S. Pat. No. 4,125,649 also include formulations containing water miscible halocarbons for pre-swelling followed by etching with chromic acid.

A published patent application (PCT Int. Appl. No. 86/US/1199, Jan. 15, 1987) to C. Courduvelis and D. E. Stone, describes formulations and processes of pre-swelling plastics such as polyether polyimide with solvents such as dimethylsulfoxide, propanediol ether, followed by etching with chromic acid.

The prior art describes neither (1) etching of polycarbonate in one step nor (2) etching of polycarbonate in two steps (pre-swelling) followed by degradation wherein polycarbonate is degraded (etched) with a solution containing a solubilizing agent, and/or a wetting agent and a base. Etching pre-swollen polycarbonate with mineral acids other than chromic acid is also not taught.

SUMMARY OF THE INVENTION

We have found that plastics of functionalized polymers having at least one hydrolyzable functionality such as anhydride, ester (carboxyl and sulfonic), amide, urethane and imide, preferably polycarbonate, can be swollen and etched for plating by certain swelling agents and degradation agents, in one, two or three steps. The etched surface provides satisfactory adhesion of electroless nickel or copper. If required, a solubilizing agent is used to increase the miscibility of degradation and swelling agents. The polymers can be swollen and etched in one bath by using a mixture of swelling (or wetting agent) and degradation agents or with a compound having the ability to swell and etch the polymers simultaneously. In the two-step process, swelling and degradation is done separately. In the three-step process, the plastic surface is swollen and etched with mineral acids followed by treatment with a base.

BRIEF DESCRIPTION OF THE INVENTION AND PREFERRED EMBODIMENTS

A water miscible swelling agent is preferred for pre-swelling polycarbonate. If the swelling agent is not itself miscible with water, or if it does not dissolve the selected basic degradation agent, it can be made miscible or a solvator by addition of a solubilizing agent.

Some representative functional groups which rapidly swell polymers such as polycarbonate include: Ether (—O—), halocarbon (X—C, where X is a halogen radical), and aromatic compounds. Certain ketones, acetals and ketals can also swell polycarbonate. Aliphatic ethers are the preferred class of compounds for swelling polycarbonate and other plastics mainly because some of them are water soluble and are stable to bases.

The following is a non-limiting list of some representative classes of compounds and specific examples of such "good solvents".

Alkyl ethers and substituted alkyl ethers, such as halo- or hydroxy-substituted alkyl ethers including ethers of alkylene glycols, arylethers, arylalkylethers, cyclic ethers and their derivatives. Preferably there are used lower alkyl and lower alkylene moieties of 1–20 and 2–20 carbon atoms respectively. As aryl moieties, phenyl, suitably substituted phenyl may be used. Specific examples include solvents such as propanediol dimethylether, ethoxyacetic acid, methoxyethylether, 2-(2-aminoethoxy)ethanol, 1,2-bis(2-chloroethoxy)ethane, 1,4-butanediol diglycidyl ether, 2-(2-n-butoxyethoxy)ethanol, 2-(2-chloroethoxy)ethanol, 2-[2-(2-chloroethoxy)ethoxy]ethanol, diethylene glycol dibutyl ether, 2-(2-ethoxy ethoxy)ethanol, 2-ethoxyethyl ether, ethylene glycol dimethyl ether, diethyleneglycol dimethylether, dipropylene glycol dimethylether, 2-methoxyethylether (diglyme), dimethoxy propane, ethoxy ethylether, butylphenylether, 2-(2-methoxyethoxy)ethanol, tetraethylene glycol dimethylether, triethylene glycol dimethylether and polyethylene glycol. Benzylether, phenylether, benzoxybenzyl alcohol, methoxybenzyl alcohol. Cyclic ethers and their derivatives, such as benzofuran, butanediol diglycidyl ether, dioxane and substituted dioxanes, trioxanes and substituted trioxanes, furans, furfuryl alcohol, morpholines and substituted morpholines such as dimethylamino ethylmorpholine, ethylmorpholine, 4-morpholineethane sulfonic acid, 4-methylmorpholine-N-oxide), tetrahydrofuran and substituted tetrahydrofurans such as dimethoxy hydrofuran or dimethoxy tetrahydrofuran.

Aldehydes, ketones, acetals and ketals derived from lower alkanols and lower alkanoic acids of 1 to 6 carbon atoms or phenyl lower alkanols or lower alkanoic acids. Included in this category are phenylacetaldehyde, glyceraldehyde, benzylacetone, dichloroacetone, methoxyacetone, benzophenone, propionaldehyde diethyl acetal, dioxolane, and trioxane may also be used.

Water miscible halocarbons which can be used as swelling agents include mono-and poly-, chloro- and fluoro-substituted derivatives of acetone, acetic acid, butanol, ethanol, and propanol. A good solvent can be made poor by adding a miscible nonsolvent and vice versa.

A compound can be used as solubilizing agent if it is soluble in the swelling agent and a nonsolvent (such as water) selected to convert a "good" swelling agent to a "poor" one. Organic compounds having —OH, —COOH, —SO$_3$H, —NH—, —NH$_2$, —NR$_3$, —N$^+$R$_4$ and other polar functionalities can act as solublizing agents. For example, ethanol, glycerols, acetic acid, and benzene sulfonic acid can be used as solublizing agents. For example, chloroform and dichloromethane have ability to swell polycarbonate but they are not miscible with water. When methanol is added to an immiscible mixture of chloroform and water, a clear solution is obtained which has ability to swell polycarbonate.

Especially desirable as solubilizing and swelling agents are alkanolamines and phenolamines such as benzyl-N-methylethanolamine, diethylaminophenol, 2-[(2-dimethylamino)ethyl]methyl aminoethanol, ethanolamine, diethanolamine, dimethyethanolamine, butyl-di-ethanolamine, triethanolamine, 5-diethylamino-2-pentanol, diethyl-ethanolamine, dialkoxybenzene, dimethylaminopropanol, dimethylethanolamine, chloroethoxyethanol, tetra kis(2-hydroxyethyl)ethylenediamine, tripentaerythritol, 2,4,6-tris(dimethylaminomethyl)phenol. Tertiary amines such as pyridine and substituted pyridines for example dialkylaminopyridines, aniline and substituted anilines, for example dialkylanilines, hexamethylenetetraamine, tetramethylethylenediamine, tetraethylenepropanediamine. Etheramines such as tris(2-methoxyethoxyethyl)amine, benzethonium, 4(2-dimethylamino)ethylmorpholine, glycerol, isopropanol, acetic acid, palmitic acid, benzoic acid, benzene sulfonic acid and dimethylformamide.

The addition of certain compounds, designated as wetting agents may permit an inactive etchant to become active. Wetting agents are inherently soluble in the inactive solvent. Thus, while they act like solubilizing agents, they cannot be so designated. Examples of such wetting agents are triethanolamine and glycerol which activate aqueous sodium hydroxide. For example, aqueous NaOH does not etch swollen polycarbonate very effectively, even at high concentration and temperature. However, an aqueous solution of triethanolamine calcium solubilizing agent which also acts as wetting agent in this case allows NaOH to etch swollen polycarbonate very effectively at room temperature and at lower concentration of NaOH.

It is quite likely that some swelling agents may form an emulsion. Such emulsions can be destroyed to form a clear solution for pre-swelling polycarbonate by adding a solubilizing and/or a wetting agent.

Thus, swelling agents which are normally insoluble in water can be used for pre-swelling polycarbonate and other plastics by using appropriate solublizing agents. Thus the choice for selection of swelling agents for plastic is widened.

There is no sharp line of demarcation between swelling agents, wetting agents and solubilizing agents. A solubilizing agent can also be a swelling agent and viceversa. For example, triethyleneglycol dimethylether is a good swelling agent. It can also be used as a solubilizing or wetting agent.

Certain compounds may be used ether as solubilizing agents or as poor solvents (useful swelling agents), for example: 2-butoxyethanol, 2-(2-butoxy ethoxy)ethanol, diethyleneglycol, monoethers of ethylene glycols, propylglycols, and glycerol, ethoxyethanol, 2(2-ethoxyethoxy)ethanol, ethers of tetraethyleneglycol, benzethonium and tetrabutylphosphoniumbromide.

Nonsolvents which convert "good" solvents to "poor" solvents, may or may not require the use of a solubilizing agent. In addition to water, there include mono- and polyhydric alcohols which, preferably do not carry halo or ether functions. Other suitable nonsolvents include alkanols and glycols of 1–20 carbon atoms.

As nonsolvents, there may be specifically recited: inorganic nonsolvents such as water and phosphoric acid. Organic nonsolvents such as hydrocarbons, suitably alkanes and phenyl alkanes of 6 to 20 carbon atoms such as: decane, toluene, xylene, etc.; alkanoic acids, suitably acetic acid, decanoic acid, citric acid, etc.; alcohols suitably lower mono and polyhydric alkanols including sugars and phenols, these are exemplified by ethanol, isopropanol, glycerol, glucose, phenol, etc.; high molecular weight amides of more than 6 carbon atoms such as octadecanamide; high molecular weight amines such as dodecyleamine; high molecular weight ketones, such as butanone, octanone; and high molecular weight esters, such as butyl acetate, dimethyloxylate. Some of the nonsolvents such as triethanolamine, can also be solubilizing agents or wetting agents.

The invention is not limited to swelling agents which are liquid at room temperature. A compound which is solid at room temperature but either can be dissolved in water or other solvents can also be used as swelling agent. A compound which has low melting point, e.g. below 150° C. can also be used in the present invention. The swelling bath can be prepared by melting the compound and maintaining the bath above the melting temperature.

Certain compounds have the ability to swell polycarbonate and also have acid or base functionality. Thus, they can simultaneously act as swelling agents as well as degradation agents. These groups of compounds should have at least one or more of the following functionalities for swelling polymer and degradation of carbonate functionality:

Compounds having functional groups such as —SO$_3$H, and —N$^+$R$_4$OH can cause degradation of polycarbonate. Under suitable conditions, e.g., with appropriate swelling agent and high temperature, polycarbonate can also be degraded by primary (R—NH$_2$), secondary amines (R—NH—R), tertiary amines (NR$_3$) and carboxylic acids (R—COOH) wherein R is alkyl, aralkyl or aryl. Aryl sulfonic acids which can be mono-, ortho-, meta- and para-substituted di-, and tri-substituted benzene sulfonic acids, and naphthalene sulfonic acids are especially suitable. Compounds having ether and N$^+$—OH functionality can also swell and etch PC, such as tris(2-methoxy ethoxyethyl)ethyl ammonium hydroxide are especially suitable.

For example, molten benzene sulfonic acid acts as a solvent to swell polycarbonate. The sulfonic acid group has ability to hydrolyze the carbonate functionality thereby degrading polycarbonate. The surface of polycarbonate becomes wettable and provides acceptable adhesion of electroless nickel, after immersion in molten benzene sulfonic acid.

Benzene sulfonic acid diluted with inorganic liquids such as water, sulfuric acid and phosphoric acid or diluted with organic liquids such as ethers are essentially unaffected by benezene sulfonic acid, can be used as pre-etching systems. The pre-etching can be controlled by diluting benzene sulfonic acid. Preferred diluents are water and aqueous sulfuric acid.

After pre-etching with the benzene sulfonic acid, polycarbonate can be etched with an inorganic or organic base such as sodium hydroxide or tetraethylammonium hydroxide. As shown, polycarbonate plaques pre-etched with benzene sulfonic acid followed by etching sodium hydroxide can be satisfactorily plated with electroless nickel.

Representative examples of quaternary ammonium compounds which can be used as degradation agents alone or with alkali metal hydroxides are Aliquot, benzalkonium chloride, benzylcetyldimethylammonium chloride, benzyltriethylammonium chloride, benzyltrimethylammonium chloride, benzyltrimethylammonium hydroxide, cetyldimethylethylammonium bromide, cetyltrimethylammonium bromide, choline chloride, choline hydroxide, tetraethylammonium bromide, tetraethylammonium hydroxide, benzyltriethylammonium chloride, and benzyltrimethylammonium hydroxide, betaine, decamethylenebis(trimethylammonium iodide), cetyltrimethylammonium bromide, hexamethonium bromide, methyltributylammonium chloride, phenyltrimethylammonium chloride, benzyltributylammonium chloride, benzyltrimethylammonium chloride, benzethonium, benzyldimethylsterylammonium chloride and benzylcetyldimethylammonium chloride.

Preferred degradation agents include quaternary ammonium hydroxides such as tetraethylammonium hydroxide and choline hydroxide. A mixture of quaternary ammonium salts such as tetraethylammonium chloride and/or choline chloride and alkali metal hydroxide such as KOH are also desirable degradation agents.

The most preferred degradation agents are alkali metal hydroxide. However, aqueous solutions of alkali metal hydroxides are not very effective in etching polycarbonate, unless solvated with a solubilizing agent and/or wetting agent.

For the one-step process the swelling agent must be stable to the base used for degradation of polycarbonate. However, stability to a base is not required for the two- and three-step etching process. In the latter cases, compounds such as inorganic and organic esters, for example, ethylacetate, glycol acetate, propylene glycol acetate, cellusolve acetate, and like can be used for pre-swelling.

While the one-step swelling/etching process is especially preferred, the two-step process for swelling, followed by etching of polycarbonate, is also equally desirable.

The one-step swelling/etching solutions can also be used as etchant solution in two-step etching process. In such case, better adhesion of electroless metal is expected because the plastic is already pre-swollen and hence etching could be faster and smoother. For better control of the etching process, one may reduce the concentration of the swelling agent in the etching solution. There is no sharp line of demarcation between the swelling/etching solution of one-step process and the etching solution of the two-step process.

Though pre-etching and etching are preferred to be carried out at room temperature, higher and lower temperatures can be used. If the reaction is fast at RT, lower temperature can be employed and vice versa.

The swelling and etching formulations and processes described here are not limited to polycarbonate. They can be used for a number of other plastics having at least one hydrolyzable functionalities such as anhydride, ester (carboxyl and sulfonic), amide, urethane and immide. (The polymer could be a copolymer and/or an alloy of two or more polymers).

EXAMPLES

The following examples are illustrative of carrying out the claimed invention but should not be construed as being limitation on the scope or spirit of the instant invention.

Hereinbelow, unless stated to the contrary, all ratios and percentages are v/v.

EXAMPLE 1

Plating Baths/Line

After preswelling and/or etching the polycarbonate parts with the formulations and processes described in Examples 15 to 40, they were plated with electroless copper or nickel using the formulations and processes described below:

1a—Catalyst: 120 ml. of 12N HCl was mixed with 880 ml. of deionized water. To this acid solution was added 40 ml. of Enplate 443 solution (supplied by Enthone INC., New Haven, Conn.) to make the catalyst bath. Etched parts were rinsed with water and immersed in the catalyst bath for 4–8 minutes, usually 6 minutes, at room temperature. The parts were rinsed with water before immersing in the accelerator bath.

1b—Accelerator: 100 ml. of Enplate Accelerator 860 (Supplied by Enthone, Inc.) was mixed with 900 ml. of deonized water to make the accelerator bath. The catalyzed parts were immersed in the accelerator bath for 8–15 minutes, usually 10 minutes, at room temperature. After rinsing the parts with water, they were immersed in either electroless nickel or electroless copper baths described below:

1c—Electroless Nickel: To 898 ml. of deionized water 47 ml. of Enplate Ni 880A (supplied by Enthone Inc.) was added. To the mixture, 55 ml. of Enplate Ni 880B solution (supplied by Enthone, Inc.) was added. The pH of the bath was adjusted to 9 with ammonium hydroxide. The plastic parts were immersed in this bath for 8 to 20 minutes at room temperature.

1d—Electroless Copper: To 560 ml. of deionized water, 80 ml. of Enplate Cu-404A and 160 ml of Enplate Cu-404B (both supplied by Enthone, Inc.) were added. The plastic parts were immersed in this bath for 8 to 120 minutes at room temperature.

EXAMPLE 2

Test Methods

Pre-etched, etched and plated polycarbonate parts were tested using the following methods:

2a—Pre-etch test: The pre-etch usually swells plastic and hence the smooth surface of the plastic becomes rough and deglazed. The degree of swelling was estimated qualitatively as follows:

Excessive Swelling: Very rough surface. Transparent sheets become essentially opaque.

Proper Swelling: Moderately micro-roughened surface. Transparent sheets become translucent.

Poor Swelling: Smooth surface. Surface remains essentially unaffected. Transparent sheets remain transparent.

2b—Etching test: Surface wettable with water. A thin layer of water remains on the etched surface.

2c—Adhesion of Electroless metals: Adhesion of electroless nickel and copper was tested using the crosshatch and thermal cycle tests.

Cross-Hatch test: The plated metal coat was cut crosswise with a cross-cut tool (Precision Gage & Tool Company, Dayton, Ohio) using the procedure described in ASTM method #D3359. One end of Scotch (cellophane) tape was firmly applied on the cross-hatch. The tape was pulled from the other end. The adhesion was rated as below:

Satisfactory: A few cross hatched pieces peel (flake) off. If proper experimental conditions of pre-etching, etching and plating are used, the satisfactory plating can become good or excellent plating.

Acceptable: No flaking off of cross-hatched pieces, but some peeling of metal occurs at crosscuts. If proper experimental conditions of pre-etching, etching and plating are used, the acceptable plating can become good or excellent plating.

Good: No flaking off of any kind.

Excellent: No flaking even after thermal cycle.

Thermal cycling: Polycarbonate parts were placed in steam autoclave for 20 minutes at 110° C. and 12 psi pressure. The parts are then cooled to room temperature. If the adhesion of plated metals is good or excellent, the plated metal does not blister or plate separation does not occur.

EXAMPLE 3

Effect of an Ether (Good Solvent or Good Swelling Agent) on Polycarbonate

Polymer: Transparent polycarbonate (Laxan) sheet
Solution: Triethylene glycol dimethylether
Results: The sheet becomes opaque in 30 seconds. Nonwettable surface, indicative of unetched surface.

EXAMPLE 4

Reducing the Surface Roughening on Polycarbonate by Adding Nonsolvent (Nonswelling Agent)

Polymer: Transparent polycarbonate (Laxan) sheet
Solution: Triethylene glycol dimethylether: water (8:2)
Results: The surface gets roughened in 10 minutes. Nonwettable surface.

EXAMPLE 5

Effect of Polyether (Poor Solvent) on Polycarbonate

Polymer: Transparent polycarbonate (Laxan) sheet
Solution: Polyethyleneglycol methylether, molecular weight=350.
Results: Damages (deglazes) the surface in 5 minutes at room temperature. Nonwettable surface.

EXAMPLE 6

Effect of Addition of Nonsolvent in Poor Solvent

Polymer: Transparent polycarbonate (Laxan) sheet
Solution: Polyethyleneglycol methylether (molecular weight=350):water (7:2)
Results: No noticeable damage at RT for 5 minutes.

EXAMPLE 7

Effect of Nonsolvent

Polymer: Transparent polycarbonate (Laxan) sheet
Solution: Polyethyleneglycol (mol.wt.=200)
Results: No noticeable damage at RT for 30 minutes.

EXAMPLE 8

Comparison Between Good, Poor and Nonsolvent

Polymer: Transparent polycarbonate (Laxan) sheet

| Liquid | Time (min.) of immersion | Clarity | Swellability |
|---|---|---|---|
| EGDME | 1 | Opaque | Good |
| EGDME:Water (8.2) | 2 | Translucent | Poor |
| EG:DME:Water (5.5) | 5 | Transparent | Bad |
| EE | 30 | Transparent | Bad |
| EG | 30 | Transparent | None |

EGDME = Ethylene glycol dimethylether, EE = Ethoxy ethanol. EG = Ethylene glycol, Temperature was room temperature.

EXAMPLE 9

Effect of Mixture of Good Solvent, Solubilizing Agent and Organic Base

Polymer: Polycarbonate (Laxan) plaque
Solution: Triethylene glycol dimethylether:isopropanol:tetraethylammonium hydroxide 25% solution (2:1:1) at room temperature for 5 minutes.
Results: Roughens the surface and surface is wettable.

EXAMPLE 10

Effect of Temperature on Pre-Etch Treatment

Polymer: Polycarbonate (Laxan) plaque
Solution: As in Example 9 but at 60° C. (Triethylene glycol dimethylether:isopropanol:tetraethylammonium hydroxide 25% solution (2:1:1) at 60° C. for 5 minutes).
Results: Highly roughened and wettable surface.

EXAMPLE 11

Solublizing a Swelling Agent

Polymer: Polycarbonate
Solution: 40 ml. of chloroform and 10 ml. of water
Result: An immiscible mixture
Solubilizing agent: 50 ml. of methanol added to above solution.
Results: The immiscible mixture forms a clear solution upon addition of methanol (solubilizing agent). This solution swells polycarbonate.

EXAMPLE 12

Solubilizing a Mixture of Swelling and Degradation Agents

Polymer: Polycarbonate (Laxan) plaque
Solution: 10 ml. of 10% aqueous solution of NaOH plus 2.5 ml. of Shipley's preconditioner (PM-921 Conditioner) which contains of water and dichloropropanol.
Results: Two layers are formed.
Solubilizing agent: 5 ml. of polyethylene glycol (mol. wt.=200) added to the above mixture.
Results: A clear single phase solution is obtained.
(NOTE: A mixture of alkali and halogenated solvent is not desirable in practice).

EXAMPLE 13

Solubilizing a Mixture of Degradation Agent and Swelling Agent

Polymer: Polycarbonate (Laxan) plaque
Solution: 10 ml. of 10% NaOH and 2.5 ml. triethylene glycol dimethyl ether.
Results: Two layers are formed.
Solubilizing agent: 2 ml. of polyethylene glycol (mol. wt.=200) added to the above mixture.
Results: A clear single phase solution is obtained. This mixture swells and etches polycarbonate. The etched surface is wettable.

EXAMPLE 14

Effect of Mild Swelling Solution Containing Inorganic Base

Polymer: Polycarbonate (Laxan) plaque
Solution: Polyethylene glycol methyl ether (molecular weight=350):water:10% NaOH (7:2:1)
Results: Polymer swells and etches in 5 minutes at RT.

EXAMPLE 15

Etching with Aqueous KOH Solution

Polymer: Polycarbonate (Laxan) plaque.
Pre-treatment: None.
Etch Formulation: 6N Aqueous solution of KOH 20 minutes, at RT
Electroless Nickel: As described in Example 1

Results: The surface remains unaffected. Nonwettable surface. Very poor adhesion of electroless nickel.

EXAMPLE 16

Etching with Alcoholic KOH Solution

Polymer: Polycarbonate (Laxan) plaque.
Pre-treatment: None.
Etch Formulation: 1:1 aqueous KOH:isopropanol, 20 minutes, at RT
Electroless Nickel: As described in Example 1
Results: The surface remains unaffected. Nonwettable surface. Poor adhesion of electroless nickel.

EXAMPLE 17

Etching with Alcoholic Tetraethyl Ammonium Hydroxide Solution

Polymer: Polycarbonate (Laxan) plaque.
Pre-treatment: None.
Etch Formulation: 10% solution of tetraethyl ammonium hydroxide in ethanol:water (90:10), 20 minutes, at RT
Electroless Nickel: As described in Example 1.
Results: The surface remains unaffected. Nonwettable surface. Poor adhesion of electroless nickel.

EXAMPLE 18

Etching with Aqueous Solution of Tetraethyl Ammonium Hydroxide

Polymer: Polycarbonate (Laxan) plaque.
Pre-treatment: None.
Etch Formulation: 20% aqueous solution of tetraethyl ammonium hydroxide 20 minutes, at RT.
Electroless Nickel: As described in Example 1.
Results: The surface remains unaffected. Nonwettable Surface. Poor adhesion of electroless nickel.

EXAMPLE 19

Plating of Polycarbonate Parts without Pre-Etch Treatment but Etched with Acids

Polymer: Polycarbonate (Laxan) plaque.
Pre-treatment: None.
Etch Formulation: Sulfuric (50 ml.) plus phosphoric (50 ml.) plus 1 ml. nitric (other ranges are: sulfuric 30-80%, phosphoric 0-50%, nitric 0.1 to 10%, and water - Balance).
Time: 5 and 10 minutes at RT.
Comments: The etched surface was not very wettable.
Electroless Nickel: As described in Example 1.
Results: Poor adhesion of electroless nickel.

EXAMPLE 20

Pre-Etch with Ether Solution Followed by Etching with Acids (2 Stage)

Polymer: Polycarbonate (Laxan)
Pre-etch: Enplate 3489:Water (75:25 v/v) (made from an ether)
Temperature: 75° C. (Temperature range: 25°-85° C.)
Time: 7 minutes (Time range tried: 3-10 minutes)
Etch Formulation: Sulfuric (50 ml.) plus phosphoric (50 ml.) plus 1 ml. nitric (other ranges are: sulfuric 30-80%, phosphoric 0-50%, nitric 0.1 to 10%, and water - Balance).
Time: 10 minutes (Other ranges: 3-30 minutes)
Temperature: RT (Other ranges: 25° to 85° C.)
Electroless Nickel: As in Example 1.
Results: Adhesion of electroless nickel: Passes the cross-hatch test and improves upon storage at RT or upon annealing at higher temperatures, e.g., 80° C. for one hour.
Comments: Plated samples need annealing to improve the adhesion of electroless nickel.

EXAMPLE 21

Pre-Etch with Ether Solution Followed by Etching with Acids (2 Stage)

Polymer: Polycarbonate (Laxan) plaque
Pre-etch Formulation: Enplate 3489:Water (75:25 v/v), 7 minutes, at RT
Etch Formulation: Sulfuric (55 ml.), and phosphoric (45 ml.), 10 minutes at RT
Electroless Nickel: As in Example 1.
Results: Excellent adhesion of electroless nickel. Passes thermal cycle test.

EXAMPLE 22

Pre-Etch with Halocarbon Solution Followed by Etching with Acids (2 Stage)

Polymer: Polycarbonate (Laxan) plaque
Pre-etch Formulation: Shipley PM 921 (prepared from dichloro propanol):Water (80:120 v/v,) 5 minutes at 45° C.
Etch #1 Formulation: Sulfuric (55 ml.), and phosphoric (45 ml.) 10 minutes at RT
Etch #2 Formulation: 10% NaOH 10 minutes at 60° C.
Electroless Nickel: As in Example 1.
Results: Excellent adhesion of electroless nickel.

EXAMPLE 23

Plating of Polycarbonate Parts without Pre-Etch Treatment but Etched with a Organic Base Polymer: Polycarbonate (Laxan) plaque
Pre-etch Formulation: None
Etch Formulation: 20% Tetraethylammonium hydroxide in water 5 minutes at RT
Electroless Nickel: As in Example 1.
Results: Polymer is essentially unaffected by this etch. Adhesion of electroless nickel and electroless copper is poor.

EXAMPLE 24

Pre-Etching with Halocarbon Solution Followed by Etching with Organic Base (2 Stage)

Polymer: Polycarbonate (Laxan) plaque
Pre-etch Formulation: Shipley PM 921:water (80:120), 10 minutes at 45° C.
Etch Formulation: 25 ml of 20% Tetraethylammonium hydroxide in water.
10 minutes at 45° C.
Electroless copper: As in Example 1.
Results: Polymer surface wettable with excellent finish & adhesion of electroless copper. Passes thermal cycle test.

EXAMPLE 25

Pre-Etching with Halocarbon Solution Followed by Etching with Organic Base Containing a Co-Solvent (2 Stage)

Polymer: Polycarbonate (Laxan) plaque
Pre-etch Formulation: Shipley PM 921:water (2:3), 10 minutes at 45° C.

Etch Formulation: 25 ml. of 20% Tetraethylammonium hydroxide in water and 10 ml. of isopropanol, 10 minutes at 45° C.
Electroless Copper: As in Example 1.
Results: Polymer surface wettable with excellent adhesion of electroless copper. Passes thermal cycle test.

EXAMPLE 26

Effect of Mixture of Solvent, Poor Solvent and Organic Base on Polycarbonate and its Platability (One-Step Etching System)

Polymer: Polycarbonate (Laxan) plaque
Swelling/Etching Solution: Triethyelene glycol dimethyl ether:polyethyelene glycol (mol. wt. 200):tetraethylammonium hydroxide 25% solution (1:1:1) at 25° C. for 5 minutes.
Electroless Nickel: As described in Example 1.
Results: Wettable after 2 minute wash with hot water. Acceptable electroless nickel plating.

EXAMPLE 27

One-Step Etching System (Without Solubilizing Agent)

Polymer: Polycarbonate (Laxan) plaque
Swelling/Solution: Triethyelene glycol dimethylether:water:tetraethylammonium hydroxide 25% solution (8:1:1) plus two drops of Aliquot at 35° C. for 5 minutes.
Electroless Nickel: As described in Example 1.
Results: Good adhesion as electroless nickel.

EXAMPLE 28

One-Step Etching System (Without Solubilizing Agent)

Polymer: Polycarbonate (Laxan) plaque
Solution: Triethylene glycol dimethylether:water:tetraethylammonium hydroxide 25% solution (8:2:3) plus two drops of Aliquot at 40° C. for 5 minutes.
Electroless Nickel: As described in Example 1.
Results: Wettable surface and excellent adhesion of electroless nickel.

EXAMPLE 29

Two-Step Etching System (Etch with Organic Base)

Polymer: Polycarbonate (Laxan) plaque
Step 1: Shipley pre-etch. 6 minutes at 45° C.
Step 2: 20% tetraethylammonium hydroxide in water at 60° C. for 5 minutes.
Electroless copper: As described in Example 1.
Results: Good adhesion of electroless copper.

EXAMPLE 30

Two-Step Etching System (Etch with Organic Base)

Polymer: Polycarbonate (Laxan) plaque
Step 1: Shipley pre-etch. 6 minutes at 45° C.
Step 2: 20% choline hydroxide in water at 60° C. for 5 minutes.
Electroless copper: As described in Example 1.
Results: Good adhesion of electroless copper.

EXAMPLE 31

Two-Step Etching System (Etch with Alkyl Ammonium Halide Plus Inorganic Base)

Polymer: Polycarbonate (Laxan) plaque
Step 1: Shipley pre-etch. 6 minutes at 45° C.
Step 2: 15% tetraethylammonium bromide+15% sodium hydroxide in water at 60° C. for 5 minutes.
Electroless copper: As described in Example 1.
Results: Good adhesion of electroless copper.

EXAMPLE 32

Two-Step Etching System (Etch with Alkyl Ammonium Halide Plus Inorganic Base)

Polymer: Polycarbonate (Laxan) plaque
Step 1: Shipley pre-etch. 6 minutes at 45° C.
Step 2: 15% Choline chloride+15% sodium hydroxide in water at 60° C. for 5 minutes.
Electroless copper: As described in Example 1.
Results: Good adhesion of electroless copper.

EXAMPLE 33

One Step Etching System (With Solubilizing Agent)

Polymer: Polycarbonate (Laxan) plaque
Pre-etch: None
Swell/Etch: 20 ml Enthone pre-etch 3489+6 ml tetraethylammonium hydroxide (20% solution in water)+5 ml. isopropanol at 60° C. for 5 minutes.
Electroless copper: As described in Example 1.
Results: Good adhesion of electroless copper.

EXAMPLE 34

Use of Solution of One-Step Etchant in Two-Step Etching

Polymer: Polycarbonate (Laxan) plaque
Step 1: 8:2 triethyleneglycol dimethylether:water, 5 minutes at RT
Step 2: 10:2.5:2 Aqueous 10% NaOH:Triethylene glycol dimethyl ether:polyethylene glycol (mol. wt. 200), 5 minutes at RT
Electroless Nickel: As described in Example 1.
Results: Good adhesion of electroless nickel.

EXAMPLE 35

Aromatic Compounds as a Pre-Etch System and Treatment with a Base

Polymer: Polycarbonate (Laxan) plaque
Pre-etching System: Benzene sulfonic acid at 65° C.
Time: 2 minutes: Highly wettable surface
0.5 minute: Highly deglazed wettable surface.
Etching System: 10% KOH aqueous solution 10 minutes at 50° C.
Results: Benzene sulfonic acid provides wettable surface. The wettable surface can be plated with electroless nickel and copper with good adhesion.

EXAMPLE 36

Aromatic Compounds Alone as an Etch System

Polymer: Polycarbonate plaque
Swelling/etching System: Molten benzene sulfonic acid at 65° C.
Time: 2 minutes: Highly wettable surface
0.5 minute: Highly deglazed wettable surface.
Results: Benzene sulfonic acid provides wettable surface. The wettable surface can be plated with electroless nickel and copper.

EXAMPLE 37

Effect of Triethanolamine on Polycarbonate

Polymer: Transparent polycarbonate (Laxan) sheet
Solution: Triethanolamine at 60° C.

Results: No effect.

EXAMPLE 38

Effect of Mixture of Triethanolamine and NaOH on Polycarbonate

Polymer: Transparent polycarbonate (Laxan) sheet
Solution: 50 ml 25% NaOH+25 ml triethanolamine, 10 minutes at 60° C.
Results: No effect.

EXAMPLE 39

Two-Step Etching System Using Triethanolamine (Wetting Agent)

Polymer: Polycarbonate (Laxan) plaque
Step 1: Enthone pre-etch 3489, 10 minutes at 45° C.
Step 2: 50 ml 25% NaOH+25 ml triethanolamine, 5 minutes at RT
Electroless nickel: As described in Example 1
Results: Good.

EXAMPLE 40

One-Step Etching System Using Triethanolamine as Solubilizing Agent/Wetting Agent Polymer: Polycarbonate (Laxan) plaque
Etching Solution: Triethanolamine:Triethyelene glycol dimethylether:NaOH:water (2.5:4:1.5:10 v/v/w/v) at 50° C. for 5 minutes.
Electroless Nickel: As described in example 1
Results: White nickel. Good adhesion.

EXAMPLE 41

Optimized Testing

Polymer: Polycarbonate (Laxan FL-900 and 920A) panels
Pre-etching: Pre-etch with Enplate 3489:water (75:25)
Temperature: 75° F.,
Time: 10 minutes for FL-900 and 5 minutes for 920A
Rinses: (cold, hot and cold water rinses)
Etching: The formulations containing (1) Triethanolamine, TEA
(varied from 30–80%), (2) Sodium hydroxide (0.5–1.5N), and (3) Water (balance) were used.
Temperature: 150°–170° F.
Time: 10 minutes
Rinse: Cold, hot and cold water rinses
Electroless Plating:
(1) Pre-catalyst: Enplate 3923, 75° F., 2 min, cold water rinse (CWR)
(2) Catalyst: Enplate 850, 75° F., 5 min, CWR
(3) Accelerator: Enplate 860, 75° F., 5 min, CWR
(4) Electroless copper: Enplate 872, 75° F., 20 min, CWR
(5) Surface activation: Enplate 452, 75° F., 1 min, CWR
(6) Electroless nickel: Enplate 426, 150° F., 5 min, CWR
(7) Annealed at 170° F. for 30 min
Results: Plated samples were autoclaved five times at 12–15 psi for 30 minutes and then tested for adhesion with the ASTM cross-hatch test method between each autoclave. The results are summarized below (1 poor–5 excellent) after five cycles:

| Concentration of TEA | Initial Conc. (N) of NaOH | | | After autoclave Conc. (N) of NaOH | | |
|---|---|---|---|---|---|---|
| | 0.5 | 1.0 | 1.5 | 0.5 | 1.0 | 1.5 |
| (A) Polycarbonate Laxan 920A panels etched at 170° F. | | | | | | |
| 30 | 2 | 5 | 5 | 1 | 2 | 2 |
| 40 | 2 | 5 | 5 | 1 | 2 | 2 |
| 50 | 4 | 5 | 5 | 3 | 5 | 5 |
| 60 | 5 | 5 | 5 | 4 | 5 | 5 |
| 70 | 5 | 5 | 5 | 5 | 5 | 5 |
| 80 | 5 | 5 | 5 | 5 | 5 | — |
| (B) Polycarbonate Laxan FL-900 panels etched at 170° F. | | | | | | |
| 30 | 2 | 5 | 5 | 1 | 4 | 5 |
| 40 | 3 | 5 | 5 | 2 | 3 | 4 |
| 50 | 5 | 5 | 5 | 4 | 5 | 4 |
| 60 | — | 5 | 5 | — | 3 | 5 |
| 70 | 5 | 5 | 5 | 4 | 5 | 5 |
| 80 | 5 | 5 | 5 | 4 | 4 | — |
| (C) Polycarbonate Laxan 920A panels etched at 150° F. | | | | | | |
| 30 | 3 | 5 | 5 | 2 | 4 | 3 |
| 40 | 2 | 5 | 5 | 1 | 5 | 5 |
| 50 | 3 | 5 | 5 | 2 | 5 | 5 |
| 60 | 4 | 5 | 5 | 5 | 5 | 5 |
| 70 | 5 | 5 | 5 | 5 | 5 | 5 |
| 80 | 5 | 5 | 5 | 5 | 5 | 5 |
| (D) Polycarbonate Laxan FL-900 panels at 150° F. | | | | | | |
| 30 | 3 | 5 | 5 | 1 | 4 | 5 |
| 40 | 4 | 5 | 5 | 1 | 3 | 5 |
| 50 | 5 | 5 | 5 | 2 | 4 | 5 |
| 60 | 5 | 5 | 5 | 2 | 5 | 5 |
| 70 | 5 | 5 | 5 | 4 | 5 | 5 |
| 80 | 5 | 5 | 5 | 5 | 5 | 5 |

EXAMPLE 42

One-Step Etching System Using Low Organic Content

Polymer: Polycarbonate (Laxan) plaque
Etching Solution: Water:NaOH:Triethanolamine:Ethyleneglycol dimethylether (120:15:28:37 w:w:w:w) at 50° C. for 10 minutes
Electroless Nickel: As described in Example 1
Results: Good adhesion.

EXAMPLE 43

Effect of Tris(2-methoxyethoxy)ethylamine on PC

Polymer: Transparent polycarbonate (Laxan) sheet
Solution: Triethanolamine at RT
Results: Deglazes PC in 30 seconds

EXAMPLE 44

Effect of Tris(2-methoxyethoxy)ethylamine (TMEA) on Polycarbonate

Polymer: Transparent polycarbonate (Laxan) sheet
Solution: TMEA:Triethanolamine:tetraethylammonium hydroxide (25%):water (6:3:2.5:2) at RT for 5 minutes at 50° C.
Electroless Nickel: As described in Example 1
Results: Good adhesion.

EXAMPLE 45

Etching and Plating of Polystyrene

Polymer: Polystyrene plaque
Solution: 10% aqueous NaOH, Triethylene glycol dimethylether:polyethylene glycol (20:5:4), 10 minutes at 60° C.
Electroless Nickel: As described in Example 1.
Results: Extremely poor adhesion of electroless nickel.

EXAMPLE 46

Etching and Plating of CR-39 (An Aliphatic Crosslinked Polycarbonate)

Polymer: CR-39 plaque
Solution: 10% aqueous NaOH, Triethyelene glycol dimethylether:polyethylene glycol (20:5:4), 10 minutes at 60° C.
Electroless Nickel: As described in Example 1.
Results: Almost satisfactory adhesion of electroless nickel.

EXAMPLE 47

Etching and Plating of Polyester (Polyethylene Terephthalate)

Polymer: Mylar (duPont)
Solution: 10% aqueous NaOH, Triethyelene glycol dimethylether:polyethylene glycol (20:5:4), 10 minutes at 60° C.
Electroless Nickel: As described in Example 1.
Results: Satisfactory adhesion of electroless nickel
Comment: Satisfactory adhesion of electroless nickel was obtained with another polyester, Dexloy-347.

EXAMPLE 48

Etching and Plating of Polyamide (Nylon 6)

Polymer: Mineral filled Nylon 6
Solution: 10% aqueous NaOH, Triethyelene glycol dimethylether:polyethylene glycol (20:5:4), 10 minutes at 60° C.
Electroless Nickel: As described in Example 1.
Results: Satisfactory adhesion of electroless nickel.

EXAMPLE 49

Etching and Plating of a Polymer Alloy

Polymer: Dow Pulse (an alloy of ABS and polycarbonate)
Solution: 10% aqueous NaOH, Triethyelene glycol dimethylether:polyethylene glycol (20:5:4), 10 minutes at 60° C.
Electroless Nickel: As described in Example 1.
Results: Satisfactory adhesion of electroless nickel.

We claim:

1. A process of two step surface etching of polymeric materials made of polymers having at least one hydrolyzable functionality selected from the group consisting of polycarbonates, anhydrides, carboxyl esters, sulphonic esters, amides and urethanes, which comprises
    the first step of exposing the surface to be etched to a liquid phase capable of microroughening said surface, comprising a good solvent for said polymer and a non-solvent for said polymer provided that where at least one member of the group of said good and said non solvents etchant is immiscible with the other, said liquid phase further comprises a sufficient amount of solubilizing agent miscible with said immiscible components to provide a single liquid phase and
    a second step of hydrolyzing the said functionalities on said surface to the extent needed to provide a water wettable surface capable of being plated with electroless nickel or electroless copper to provide a plated layer having a strong level of adhesion to said surface by treating said surface with an etchant selected from the group consisting of
        acidic etchants selected from the group consisting of aqueous mineral acids free of metallic components, benzene sulphonic acid and mixtures thereof and
        basic etchants selected from the group consisting of alkali metal hydroxides, quaternary ammonium hydroxides and mixtures thereof in the presence of an alkanolamine.

2. A process of claim 1, wherein the polymer is a polycarbonate.

3. A process of claim 1, wherein said good and said non solvents are immiscible and said liquid phase further comprises a solubilizing agent miscible with said good and said non solvents.

4. A process of claim 3, wherein the solubilizing agent is selected from the group consisting of lower alkanoic acids, lower alkylene glycols, lower alkanols and benzene sulphonic acid.

5. A process of claim 1, wherein the liquid phase comprises benzene sulphonic acid.

6. A process of claim 1, wherein the good solvent is selected from the group consisting of mono- or di-lower alkyl ethers of mono-, di- or tri-lower alkylene glycols.

7. A process of claim 6, wherein the good solvent is selected from the group consisting of mono- or di-methyl or ethyl ethers of mono-,di- or tri-ethylene glycol.

8. A process of claim 1, wherein the non-solvent is selected from the group consisting of water, lower alkylene glycols and lower alkanols.

9. A process of claim 1, wherein the etchant is a basic etchant in the presence of a wetting agent.

10. A process of claim 1, wherein the etchant is a basic etchant consisting essentially of triethanolamine and aqueous sodium hydroxide.

11. A process of claim 10, wherein the concentration of the triethanolamine is between 30 and 80% w/w of the etchant and the sodium hydroxide is 0.5 to 1.5N.

12. A process of claim 11, wherein the second step hydrolyzing reaction temperature is between 150° and 170° F.

13. A process of claim 12, wherein the polymer is a polycarbonate.

* * * * *